United States Patent
Roberts et al.

(10) Patent No.: US 7,285,955 B2
(45) Date of Patent: Oct. 23, 2007

(54) SYSTEM AND METHOD FOR IMPROVED DATA ACQUISITION FOR MEDICAL IMAGING

(75) Inventors: Timothy Paul Leslie Roberts, Toronto (CA); Marshall Stephen Sussman, Toronto (CA)

(73) Assignee: University Health Network, Toronto (CA)

(*) Notice: Subject to any disclaimer, the term of this patent is extended or adjusted under 35 U.S.C. 154(b) by 0 days.

(21) Appl. No.: 11/407,960

(22) Filed: Apr. 21, 2006

(65) Prior Publication Data

US 2006/0238193 A1 Oct. 26, 2006

Related U.S. Application Data

(60) Provisional application No. 60/673,375, filed on Apr. 21, 2005.

(51) Int. Cl.
*G01V 3/00* (2006.01)

(52) U.S. Cl. ..................... 324/309; 324/307

(58) Field of Classification Search ............. 324/309, 324/307, 300
See application file for complete search history.

(56) References Cited

U.S. PATENT DOCUMENTS

| | | | |
|---|---|---|---|
| 6,404,194 B1 | 6/2002 | Irarrazabal et al. | |
| 6,828,788 B2* | 12/2004 | Wang | 324/309 |
| 7,023,207 B1* | 4/2006 | Gaddipati et al. | 324/309 |
| 2007/0063701 A1* | 3/2007 | Vu | 324/307 |

* cited by examiner

*Primary Examiner*—Louis M. Arana
(74) *Attorney, Agent, or Firm*—Bereskin & Parr

(57) ABSTRACT

Various embodiments are described herein for acquiring MRI image data from an object. Various waveforms are provided for producing magnetic field gradients and an RF excitation field such that NMR response signals are sampled according to a spiral-PR k-space trajectory having a plurality of angular sectors. A given angular sector can be defined by a sampling function having a period that defines radial sampling density and an envelope function that defines the angular extent of the angular sector. Various sampling and envelope functions can be used and a variety of values for the parameters for these functions can be used.

29 Claims, 5 Drawing Sheets

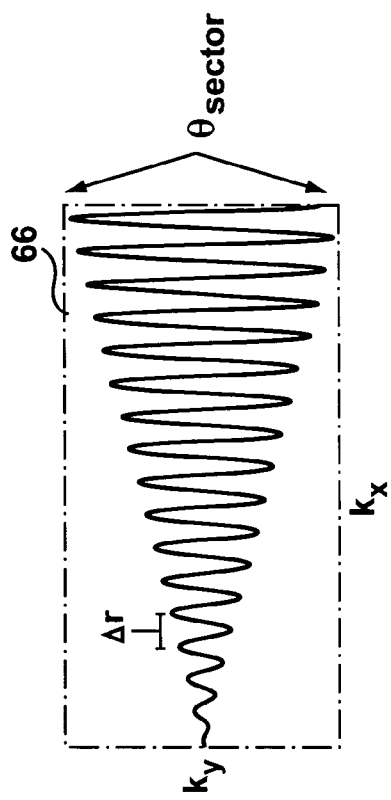
FIG. 4
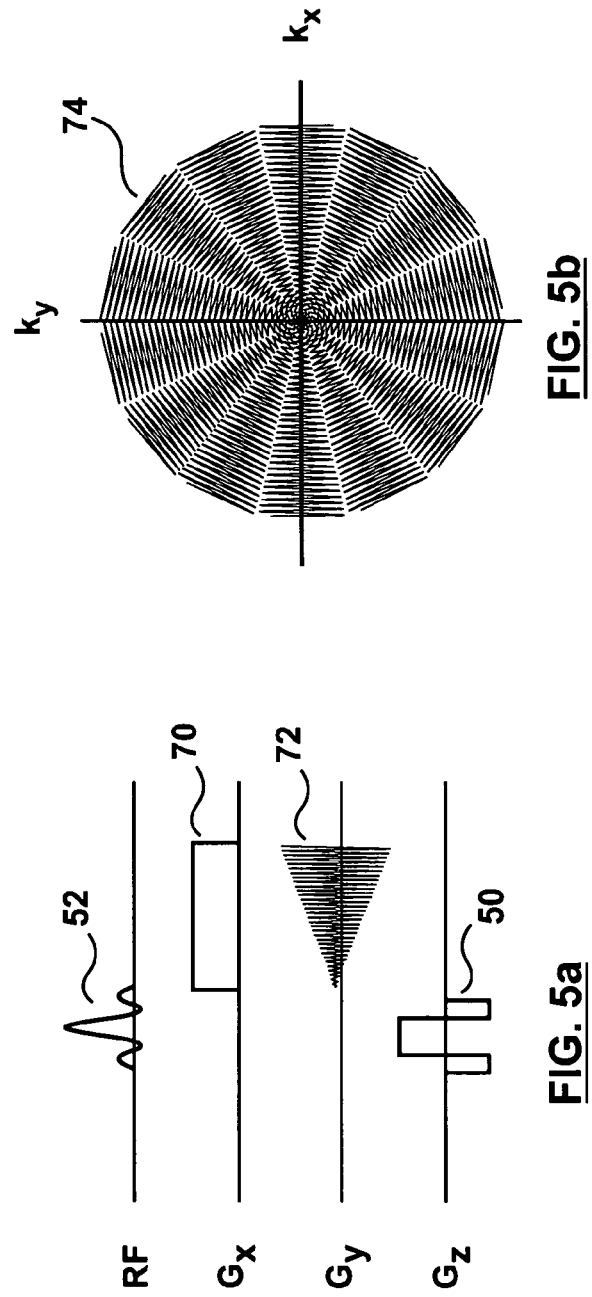
FIG. 5b
FIG. 5a

SYSTEM AND METHOD FOR IMPROVED DATA ACQUISITION FOR MEDICAL IMAGING

REFERENCE TO RELATED APPLICATION

This application claims priority from U.S. Provisional Patent Application Ser. No. 60/673,375 filed on Apr. 21, 2005.

FIELD

Various embodiments are described herein relating to improved data acquisition for nuclear Magnetic Resonance Imaging (MRI).

BACKGROUND

MRI systems are commonly used to obtain an interior image from a patient for a particular region of interest that can be used to determine the health of the patient. MRI systems include a main magnet assembly for providing a strong uniform main magnetic field to align the individual magnetic moments of the $^1H$ atoms within the patient's body. During this process, the $^1H$ atoms oscillate around their magnetic poles at their characteristic Larmor frequency. If the tissue is subjected to an additional magnetic field, which is tuned to the Larmor frequency, the $^1H$ atoms absorb additional energy, which rotates the net aligned moment of the $^1H$ atoms. The additional magnetic field is typically provided by an RF excitation signal. When the additional magnetic field is removed, the magnetic moments of the $^1H$ atoms rotate back into alignment with the main magnetic field thereby emitting an NMR signal. The NMR signal is received and processed to form an MRI scan or image. The MRI scan is based on the distribution of $^1H$ atoms within the body. Bodily fluids have the highest density of $^1H$ atoms, followed by soft tissues, then cartilage and then membranes.

If the main magnetic field is uniform across the entire body of the patient, then the RF excitation signal will excite all of the $^1H$ atoms in the sample non-selectively. Accordingly, in order to image a particular portion of the patient's body, magnetic field gradients Gx, Gy and Gz in the x, y and z directions, having a particular timing, frequency and phase, are superimposed on the uniform magnetic field such that the RF excitation signal excites the $^1H$ atoms along a desired slice of the patient's body and unique phase and frequency information is encoded in the NMR signal depending on the location of the $^1H$ atoms along the "image slice". Gradient magnets are switched on to provide the gradient magnetic fields Gx, Gy and Gz. The frequencies in the NMR signal come from different locations in the selected slice, while the signal strength reveals the density of the $^1H$ atoms. The frequencies in the NMR signal also depend on the strength of the local magnetic field produced by the combination of the uniform magnetic field and the gradient magnetic fields at the selected slice.

Typically, portions of the patient's body to be imaged are scanned by a sequence of measurement cycles in which the magnetic field gradients Gx, Gy and Gz vary according to the particular MRI imaging protocol that is being used. For each MRI scan, the resulting NMR signals are digitized and processed to reconstruct the image in accordance with the MRI imaging protocol that is used, many of which are well known to those skilled in the art.

In MRI systems, two important parameters are the time required to obtain MRI data to produce the medical images and the quality of the medical images. Reduction in data acquisition time is important, since reduced imaging time can result in improved image quality by reducing the chance that a motion artifact occurs, improve patient comfort since some patients experience claustrophobia when placed in the imaging device, and increase the number of patients that can be tested in a given time period. A reduction in imaging time also enables the performance of specialized medical test procedures such as functional MRI tests. An increase in image quality allows for more accurate interpretation and diagnosis of any health issues that the patient may have.

To reduce data acquisition time, various techniques have been proposed for sampling the NMR signal. The data acquired from the NMR signal is referred to as k-space data which is a two-dimensional data set. The k-space data provides frequency and phase information from which an MRI image is produced via application of the inverse 2D Fourier Transform, for example. The manner in which the NMR signal is generated and sampled to provide the 2D k-space data is referred to as a k-space trajectory. Different k-space trajectories confer different properties on the reconstructed MRI image.

One example of a k-space trajectory is a polar k-space trajectory in which data is acquired in a coordinate system that is described by radial (r) and azimuthal (θ) variables. The most common polar trajectories are spiral [1] and projection-reconstruction (PR) [2] k-space trajectories. Polar trajectories can generate high-quality images from undersampled data [3]. This is accomplished by employing a variable-density sampling strategy which undersamples the outer regions of k-space while maintaining a sufficient density in the inner region. Since only the low-intensity outer k-space data experiences aliasing, the intensity of the resulting artifact in the reconstructed image is low [4,2].

Generally, in a fixed data acquisition time, undersampling the k-space data by varying the k-space trajectory provides a means for trading off improved spatial resolution versus increased artifact. However, one drawback with existing polar trajectories is a limited ability to vary the sampling density, and thus alter the parameters of the resolution-artifact tradeoff. For instance, the spiral k-space trajectory can only be varied in the radial direction, while the PR k-space trajectory can only be varied in the azimuthal direction. Additionally, the PR k-space trajectory always varies at a fixed rate proportional to 1/r. This limited flexibility in varying the k-space trajectory restricts one's ability to alter, and thus optimize, the parameters of the resolution-artifact tradeoff.

SUMMARY

A new polar k-space trajectory, referred to as a spiral-PR k-space trajectory, for generating and sampling NMR signals during MRI scans is described herein. The spiral-PR k-space trajectory employs spiral sampling on one or more k-space axes, and PR sampling on the remaining k-space axes for higher dimensional k-space data sets. The spiral-PR k-space trajectory allows for the sampling density to be independently and arbitrarily varied in both the radial and azimuthal directions concurrently and independently of one another. As a result, the spiral-PR k-space trajectory permits flexibility in varying, and thus optimizing, the resolution-artifact tradeoff inherent in undersampled k-space data acquisition. Accordingly, the spiral-PR k-space trajectory provides a more flexible variable sampling density capability in comparison with conventional k-space sampling trajectories.

In one aspect, at least one embodiment described herein provides an MRI system for acquiring MRI image data from an object. The MRI system comprises an MRI device for generating a uniform magnetic field through the object, magnetic field gradients for imaging a portion of the object and an RF excitation field for evoking NMR response signals from the object; a computing device for controlling the operation of the MRI system; and, interface circuitry for receiving instructions from the computing device and generating waveforms in response to the instructions and sending the waveforms to the MRI device for producing the magnetic field gradients and the RF excitation field. The interface circuitry generates the waveforms and samples the NMR response signals according to a spiral-PR k-space trajectory having a plurality of angular sectors. A given angular sector is defined by a sampling function having a period that defines radial sampling density and an envelope function that defines the angular extent of the angular sector.

In another aspect, at least one embodiment described herein provides a method for acquiring MRI image data from an object. The method comprises:

(a) generating a uniform magnetic field through the object;

(b) generating magnetic field gradients for imaging a portion of the object, at least a portion of magnetic field gradients being generated for enabling a spiral-PR k-space sampling trajectory for data acquisition;

(c) generating an RF excitation field for evoking NMR response signals from the object; and, (d) sampling the NMR response signals according to the spiral-PR k-space trajectory having a plurality of angular sectors, wherein a given angular sector is defined by a sampling function having a period that defines radial sampling density and an envelope function that defines the angular extent of the angular sector.

In another aspect, at least one embodiment described herein provides a computer program product for acquiring MRI image data from an object. The computer program product comprises a computer readable medium embodying program code means executable by a processor for carrying out the above-noted method.

In another aspect, at least one embodiment described herein provides an MRI system for acquiring MRI image data from an object. The MRI system comprises: an MRI device for generating a uniform magnetic field through the object, magnetic field gradients for imaging a portion of the object and an RF excitation field for evoking NMR response signals from the object; a computing device for controlling the operation of the MRI system; and interface circuitry for receiving instructions from the computing device and generating waveforms in response to the instructions and sending the waveforms to the MRI device for producing the magnetic field gradients and the RF excitation field. The interface circuitry is configured to sample the NMR response signals by employing a spiral-PR k-space trajectory having a plurality of angular sectors. A given angular sector comprises a two-dimensional function with an amplitude bounded by the limits of the given angular sector.

BRIEF DESCRIPTION OF THE DRAWINGS

For a better understanding of the various embodiments described herein and to show more clearly how they may be carried into effect, reference will now be made, by way of example only, to the accompanying drawings in which:

FIG. 2b shows the resulting k-space trajectory that corresponds to the waveforms shown in FIG. 2a;

FIG. 4 is an exemplary diagram of one sector of a spiral-PR k-space trajectory;

FIGS. 5a and 5b show exemplary waveforms that can be applied to the gradient and RF coil assemblies of the MRI system and the resulting spiral-PR k-space trajectory, respectively;

DETAILED DESCRIPTION

Figure 1:
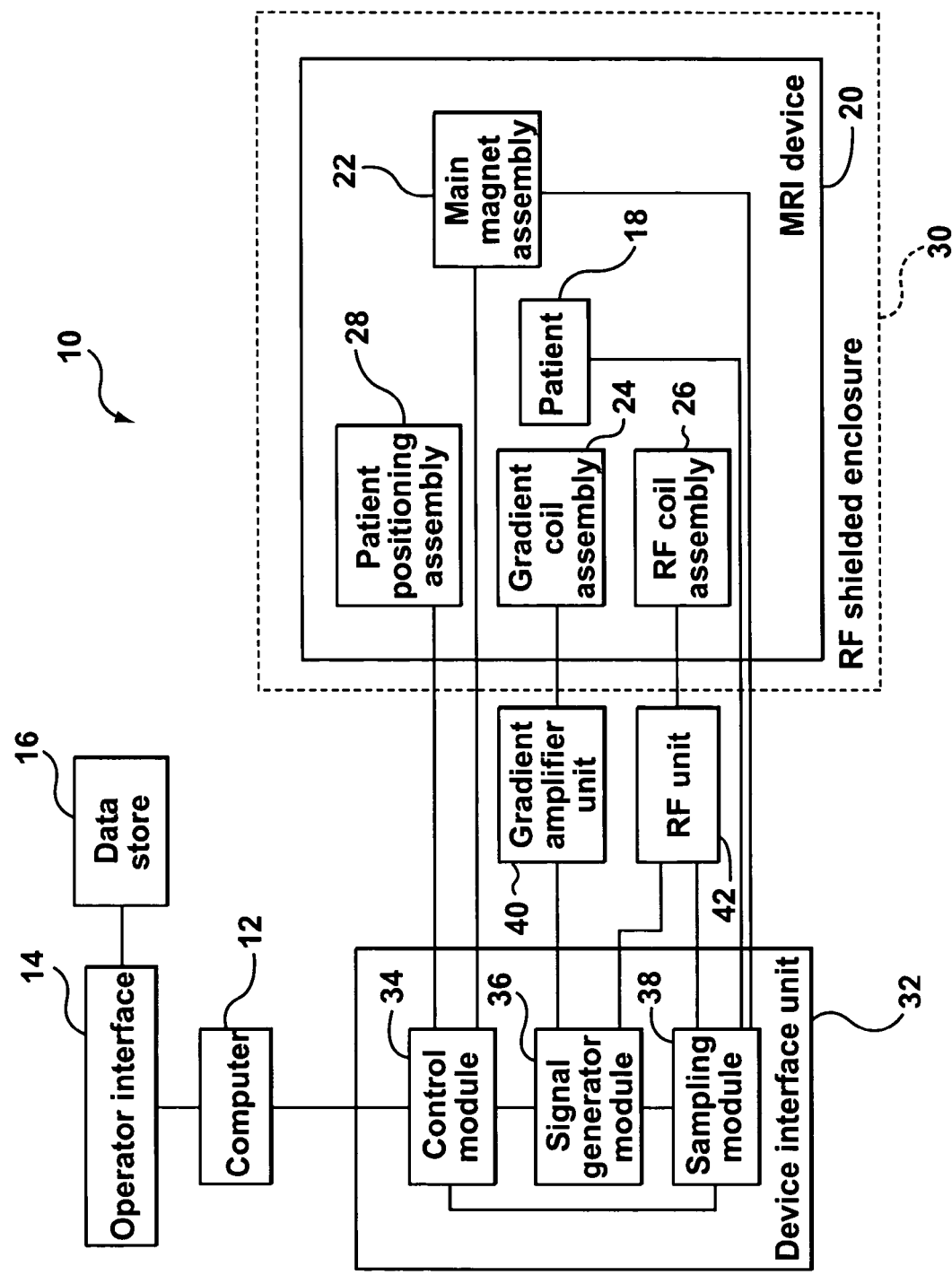
FIG. 1 is a block diagram of an exemplary embodiment of an MRI system.

It will be appreciated that numerous specific details are set forth in order to provide a thorough understanding of the various embodiments described herein. However, it will be understood by those of ordinary skill in the art that the various embodiments may be implemented without these specific details. In other instances, well-known methods, procedures and components have not been described in detail so as not to obscure the embodiments described herein. Further, where considered appropriate, reference numerals may be repeated among the figures to indicate corresponding or analogous elements.

Referring now to FIG. 1, shown therein is a block diagram of an exemplary embodiment of an MRI system 10. The MRI system 10 includes a computing device such as a computer 12, an operator interface 14 and a data store 16. The MRI system 10 further includes several power supplies (not shown) connected to various components of the MRI system 10 as is commonly known to those skilled in the art. The computing device can alternatively be a digital signal processor, and the like, that can perform similarly to the computer 12 for the purposes of MRI data acquisition.

An operator interacts with the computer 12 via the operator interface 14 to control the activity of the MRI system 10. The operator interface 14 may include a keyboard, a display, a mouse, a trackball and other suitable user input/output devices. The operator can use the operator interface 14 to input data related to a patient 18 that is being imaged such as patient identification information and test information including the nature of the MRI scan that must be performed. The operator can also use the operator interface 14 to input information needed for system parameters that are needed for proper operation of the MRI system 10 such as calibration information and system operating parameters including scan type, scan length, magnetic field strength, the type of sampling that is used, and the like. Data that is obtained from tests, as well as parameters used for system operation, may be stored in the data store 16. The data store 16 may be a separate hard drive or some other suitable data storage device. The stored data may include raw sampled data as well as processed MRI image data.

The MRI system 10 further includes an MRI device 20 that provides components for generating magnetic fields to magnetize and scan the patient 18 and for positioning the patient 18 depending on the portion of the patient 18 that is to be imaged. The MRI device 20 includes a main magnet assembly 22, a gradient coil assembly 24, an RF coil assembly 26 and a patient positioning system 28. To reduce interference from external sources, the MRI device 20 is placed within an RF-shielded enclosure 30.

The main magnet assembly 22 may be a resistive magnet, or a superconductive magnet which both require a power supply (not shown) for operation. Alternatively, the main magnet assembly 22 may include a permanent magnet. The main magnet assembly 22 includes a bore that the patient 18 is placed within. A shim power supply (not shown) may also be used to energize shim coils (not shown) that are used with the main magnet assembly 22 to correct any non-uniformity in the main magnetic field that is generated by the main magnet assembly 22.

Typically, the gradient coil assembly 24 and the RF coil assembly 26 are also placed within the bore of the main magnet assembly 22 and are circumferentially located with respect to the patient 18. It is understood by those skilled in the art that the magnet 22, and coils 24 and 26 can be situated in a variety of configurations around the patient 18.

The gradient coil assembly 24 is energized to generate magnetic field gradients Gx, Gy and Gz that are superimposed on the main magnetic field produced by the main magnet assembly 22.

The RF coil assembly 26 may include one set of coils for transmitting and receiving RF energy or separate transmit and receive coils for separately transmitting and receiving RF energy. The RF coil assembly 26 generates the RF excitation pulses which, in combination with the magnetic field gradients Gx, Gy and Gz, encode spatial information into the NMR signals generated by the region of the patient 18 being imaged. The NMR signals are also sensed by the RF coil assembly 26.

The patient positioning system 28 includes a patient cradle and a transport unit (both not shown) and interfaces with an alignment system (not shown) associated with the main magnet assembly 22 as is commonly known by those skilled in the art. The patient 18 lies on the patient cradle and is positioned by the transport unit within the bore of the main magnet assembly 22. The transport unit may position the patient 18 at certain locations within the bore of the main magnet assembly 22 in conjunction with the alignment system according to the MRI scan protocol.

The MRI system 10 further comprises a device interface unit 32 that includes a control module 34, a signal generator module 36, and a sampling module 38. The MRI system 10 further includes a gradient amplifier unit 40 and an RF unit 42. The device interface unit 32, the gradient amplifier unit 40 and the RF unit 42 may be referred to as interface circuitry that interfaces the computer 12 to the MRI device 20.

The control module 34 receives instructions from the computer 12 to follow a particular MRI scan protocol for imaging the patient 18. The control module 34 instructs the patient positioning system 28 to move the patient 18 into the proper position within the bore of the main magnet assembly 22 according to the MRI scan protocol. Depending on the type of magnet used in the main magnet assembly 22, the control module 34 may also provide certain control signals to the main magnet assembly 22 to control various parameters of the main magnetic field that is generated by the main magnet assembly 22. The control module 34 also instructs the signal generator module 36 to generate a particular gradient waveform sequence and pulse sequence that will be applied to the gradient coil assembly 24 and the RF coil assembly 26 by the gradient amplifier unit 40 and the RF unit 42 respectively. The control module 34 can also provide timing information to the sampling module 38, including the length of data acquisition and the type of k-space data acquisition that is used, for sampling data from the RF coil assembly 26. The control module 34 can also provide timing information for sampling data from the patient 18 and the main magnet assembly 22.

The signal generator module 36 produces the proper gradient waveforms Gx, Gy and Gz and RF waveforms needed for a variety of MRI scan protocols including spin echo, fast spin echo, and the like. The signal generator module 36 receives control signals from the control unit 34 to set the shape and timing of the magnetic field gradients that are generated by the gradient coil assembly 24. Based on these control signals, the signal generator module 36 also generates RF waveforms for setting the amplitude, shape and timing of the RF pulses that are produced by the RF coil assembly 26. Both of the sets of gradient and RF waveforms may be created digitally and the signal generator module 36 may further include a digital to analog converter (DAC) (not shown) that converts the digital waveforms to corresponding analog waveforms. The signal generator module 36 may further include a switching device that connects the output of the DAC to either the gradient amplifier unit 40 or the RF unit 42. Alternatively, separate DACs may be used to send the gradient pulse waveforms and the RF waveforms to the gradient amplifier unit 40 and the RF unit 42 respectively. The signal generator 36 may also generate timing signals that are sent to the sampling module 38 so that the NMR signals are correctly sampled depending on the type of gradient and RF waveforms that are sent to the gradient coil assembly 24 and the RF coil assembly 26 respectively.

The gradient amplifier unit 40 typically includes three amplifiers (not shown), i.e. one amplifier for each of the gradient pulse waveforms Gx, Gy and Gz. The gradient amplifier unit 40 receives the analog version of the gradient pulse waveforms, amplifies these waveforms and applies them to the corresponding coils in the gradient coil assembly 24. In alternative embodiments, the gradient amplifier unit 40 may receive digital waveforms and can include a DAC for processing and applying these waveforms to the corresponding coils.

The RF unit 42 includes a transceiver, a transmit amplifier, a receive amplifier and an analog to digital converter (ADC) (all not shown) as is commonly known to those skilled in the art. The transceiver receives the RF waveforms from the signal generator module 36, and modulates these waveforms to generate RF excitation pulses. The transmit amplifier receives and amplifies the RF excitation pulses and provides the amplified RF excitation pulses to the RF coil assembly 26 which radiates these pulses to the patient 18. After excitation, the NMR signals generated by the patient 18 are sensed by the RF coil assembly 26. The receive amplifier then receives the sensed NMR signals from the RF coil assembly 26, amplifies the sensed NMR signals and provides the amplified NMR signals to the transceiver. The transceiver then pre-processes the amplified NMR signals by applying demodulation and filtering. The pre-processed NMR signals are then sent to the sampling module 38 for sampling.

The sampling module 38 receives and samples the pre-processed NMR signals to produce raw k-space data. The k-space data provides information about the MRI scan in the spatial frequency domain. The sampled k-space data contains spatial data for each imaging "slice" that is measured and thus can be arranged into a series of two-dimensional (2D) arrays. Each k-space data entry provides frequency and phase information and can be arranged such that the frequency information increases along the x-axis of a given 2D k-space data array and the phase information increases along the y dimension of the given 2D k-space data array. The centre of the 2D k-space data array represents DC and the edges of the 2D k-space data array correspond to high spatial frequencies.

The raw k-space data is sent to the control module 34 where it may be further processed and/or sent to the computer 12 for processing and storing on the data store 16. In both cases, processing produces MRI image data from the raw k-space data. The MRI image data may be displayed on the display (not shown) of the operator interface 14. The MRI image data may also be further image processed by either the control module 34 or the computer 12. Processing typically includes application of the inverse 2D Fourier Transform to generate image data from a 2D k-space data set. Accordingly, the control module 34 may further include dedicated processing circuitry such as an array processor, as is well known to those skilled in the art, that inverse Fourier transforms the raw k-space data. The array processor is used to speed up numeric computation. Other types of image processing algorithms may also be applied to the MRI image to improve the quality of the MRI images.

In alternative embodiments, the system 10 can also include various sensors attached to the patient for collecting information about the patient 18 including EEG, ECG and EMG data. In these cases, the sampling module 38 can be connected to these sensors for collecting the information. The sampling module 38 may also be connected to the main magnet assembly 22 to record data about the main magnetization field.

Figure 2B:
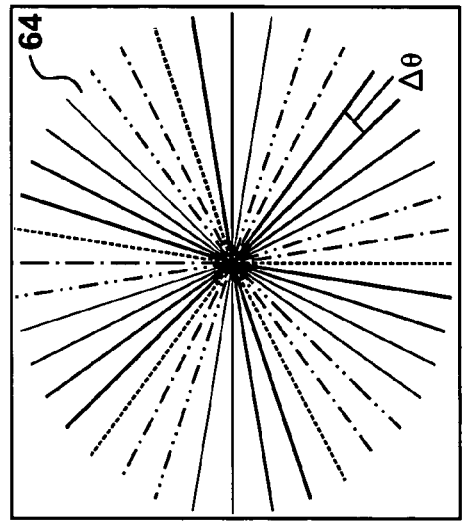
Figure 2A:
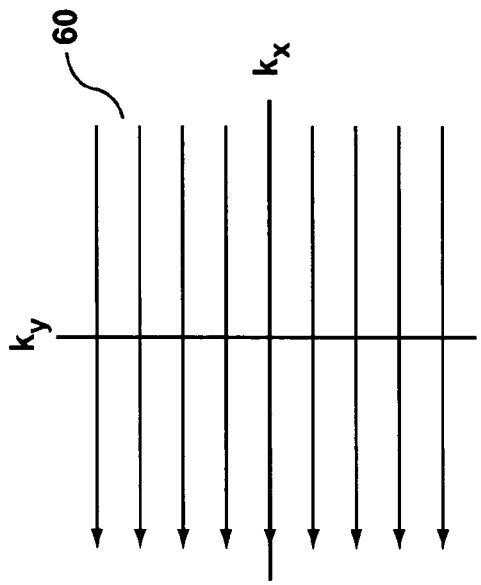
FIG. 2a shows exemplary waveforms that can be conventionally applied to the gradient and RF coil assemblies, respectively, of the MRI system.

The application of magnetic field gradients in MRI imaging can be used to sample the k-space data in a particular manner, i.e. according to a particular k-space trajectory. For instance, referring now to FIG. 2a, shown therein are exemplary waveforms that may be applied to the gradient and RF coil assemblies 24 and 26 of the MRI system 10 to generate gradient magnetic fields and an RF excitation field within the MRI device 20. FIG. 2b shows the corresponding k-space trajectory 60 that results due to the frequency and phase information encoded in the NMR signals by the gradient magnetic fields Gx and Gy.

The Gz gradient waveform includes a gradient waveform 50 for selecting a particular slice of the patient 18 for imaging for a particular duration of time in conjunction with an RF pulse 52 in the RF waveform. The RF pulse 52 has a frequency that is appropriate for exciting the $^1$H atoms in the patient 18 along the image slice selected by the magnetic field gradient Gz. Note the appropriate frequency will depend on the main MRI scanner magnetic field, the amplitude of the gradient waveform 50 and the spatial location of the desired $^1$H atoms. The RF pulse 52 is applied to the RF unit 42 at the same time as the gradient waveform 50 is applied to the Gz gradient coils for generating the RF magnetic field and the Gz gradient magnetic field at the same time so that $^1$H atoms are excited along the slice of the patient 18 that is "selected" for imaging by the Gz gradient magnetic field. Once the gradient waveform 50 and the RF pulse 52 have been terminated, the Gx and Gy gradient magnetic fields are produced to add spatial and phase information to the NMR signals released by the $^1$H atoms due to the additional excitation energy provided by the RF magnetic field. The frequency and phase encoding in the NMR signals provided by the Gx and Gy gradient magnetic field allow the samples obtained by the sampling module 38 to be reconstructed into 2D k-space data according to the k-space trajectory 60 shown in FIG. 2b. For instance, one dimension of the image slice is encoded by the Gy gradient magnetic field which yields a vertical phase shift across the slice of the patient 18 to be imaged. Therefore, rows of the corresponding 2D k-space data set are at a different phase with respect to one another. The other dimension of the image slice is encoded by the Gx gradient magnetic field which yields a shift in frequencies across the slice of the patient 18 to be imaged. Therefore, columns of the corresponding 2D k-space data set are at a different frequency with respect to one another. The result is that each data entry, or voxel, in the 2D k-space data set have a unique phase and frequency for producing the MRI image.

In the example shown in FIG. 2a, the waveform 54 for the Gx gradient magnetic field has a negative going portion for beginning the sampling in k-space at the far right of FIG. 2b. A k-space trajectory usually begins at the origin of k-space and the negative going portion of the Gx gradient magnetic field shifts the k-space trajectory to the right-hand side of k-space. The waveform 54 also includes a portion with a suitable gradient magnetic field to scan the x-dimension of the k-space trajectory 60. The waveform 56 for the Gy magnetic field gradient represents a series of steps in phase that are applied to move the k-space trajectory vertically by a certain amount that corresponds to the amount of phase shift that is provided by the Gy magnetic field gradient.

The plane of the image slice may also be selected in different ways than just described. For instance, one of the Gx and Gy gradient magnetic fields may be used to select the slice of the patient 18 to be imaged and the remaining magnetic field gradients may be used to add frequency and phase information to the NMR signal produced by the excited $^1$H atoms.

The image slice data may also be sampled in different ways using different k-space trajectories to reduce the amount of data acquired by the sampling module 38 and therefore speed up the MRI scan acquisition time or to provide certain regions of the k-space data set with more resolution to provide a more accurate MRI image. For instance, different k-space trajectories may be used to sample more densely in certain regions of the k-space data such as near the origin or the low frequency region of the k-space data.

Figure 3B:
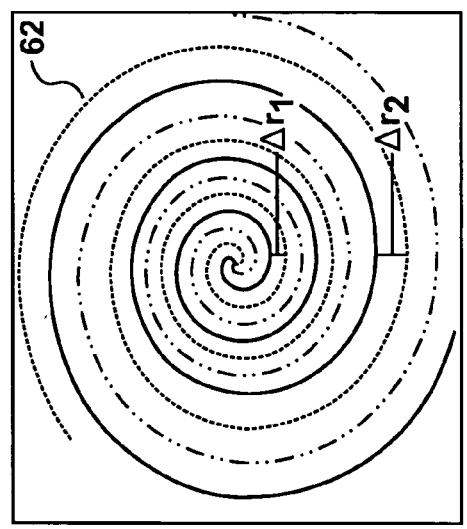
FIG. 3b is an exemplary diagram of a conventional PR spiral k-space trajectory.
Figure 3A:
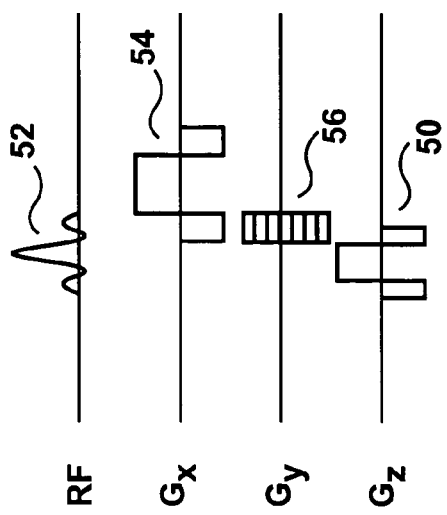
FIG. 3a is an exemplary diagram of a conventional spiral k-space trajectory.

Referring now to FIGS. 3a and 3b, shown therein is an exemplary variable density spiral k-space trajectory 62 and a variable density PR k-space trajectory 64, respectively. The sampling density for both of the k-space trajectories 62 and 64 are higher in the inner regions compared to the outer regions. For instance, the sampling density of the inner region of the spiral k-space trajectory 62, represented by $\Delta r_1$, is higher than the sampling density of the outer region represented by $\Delta r_2$. The sampling density can be adjusted by interleaving several spirals as well as by varying the values of the parameters used to generate the spiral trajectories. Currently, three spirals are interleaved for the spiral k-space trajectory 62.

With respect to FIG. 3b, the sampling density near the origin of the k-space data corresponding to the PR k-space trajectory 64 is more dense than the sampling occurring in the outer region as defined by Δθ. The sampling density can be adjusted by varying the number of projections or "rays" used in the PR k-space trajectory 64. The relative sampling density (i.e. the center versus the outer region of the k-space trajectory), however, remains unchanged.

However, for both the spiral and PR k-space trajectories 62 and 64, there is a limited ability to vary the density, and thus alter the parameters of the resolution-artifact tradeoff. The spiral k-space trajectory 62 can be varied only in the radial direction, while the PR k-space trajectory can only be varied in the azimuthal direction at a fixed rate proportional to 1/r.

Figure 6A:
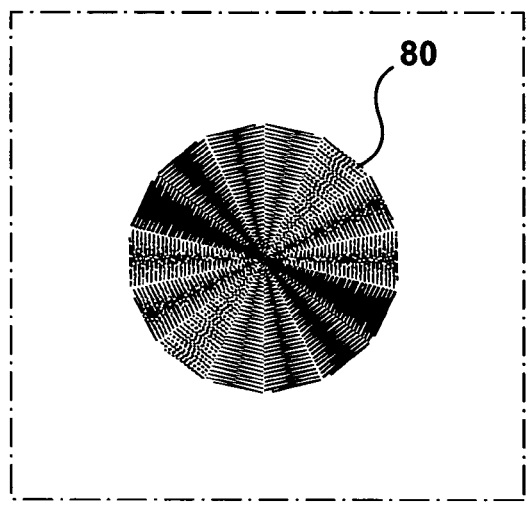
FIGS. 6a and 6b show exemplary fully-sampled and under-sampled spiral-PR k-space trajectories respectively.
Figure 6B:
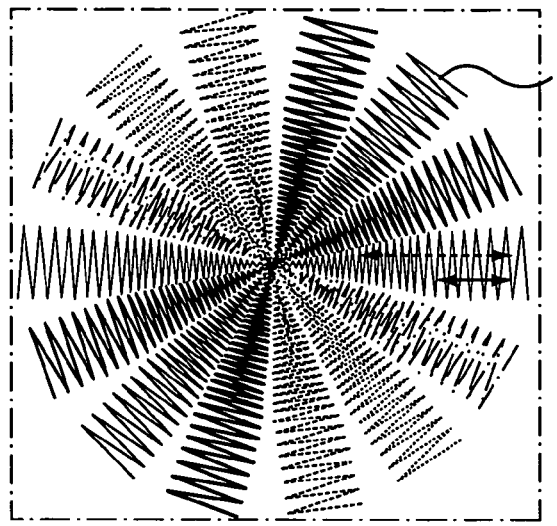

Referring now to FIG. 4, shown therein is an exemplary diagram of one sector of a spiral-PR k-space trajectory 66. The spiral-PR k-space trajectory 66 is replicated for different sectors of a given k-space data set to sample the k-space data set as desired. The spiral-PR k-space trajectory 66 is a hybrid k-space trajectory that employs a version of PR sampling along one gradient axis and a version of spiral sampling along the other gradient axis. Undersampling may be used as shown in FIG. 6b, or full-sampling may be used as shown in FIG. 6a.

With regards to the azimuthal dimension, rather than using rays or lines at a given azimuthal angular increment, the spiral-PR k-space trajectory 66 uses a sampling function that extends along a given radial length and varies in an extended fashion along the azimuthal direction. The sampling function is also bounded in the azimuthal direction by an angle $\theta_{sector}$ to cover a given sector of the k-space data. In other words, a given angular sector includes a two-dimensional function with an amplitude bounded by the limits of the given angular sector. The azimuthal sampling density is related to the amplitude of the sampling function and the spacing between adjacent sectors. The spiral-PR k-space trajectory 66 therefore provides a large degree of azimuthal sampling control especially in comparison to the spiral and PR k-space trajectories 62 and 64. One example of a sampling function that may be used is a sinusoid as shown in FIG. 4 that has an outwardly expanding envelope function along the azimuthal dimension. It may be possible to use other periodic functions for the sampling function as well. In this example, the envelope function is defined by a linear function. However, the envelope function may be defined by other functions including an exponential function, a staircase function, a piece-wise linear function and the like.

With regards to the radial dimension, the sampling function of the spiral-PR k-space sampling trajectory 66 has a period that can be varied to provide the desired radial sampling density Δr. The resolution of the data acquired according to the spiral-PR k-space sampling trajectory 66 is related to how far data the spiral-PR k-space sampling trajectory 66 extends radially beyond the origin of k-space. The spiral-PR k-space sampling trajectory 66 provides the flexibility needed to sample at a higher resolution by allowing one to undersample the k-space data in certain areas according to the spacing Δr (examples of this are shown in FIGS. 6a and 6b). However, in other embodiments, the radial sampling density Δr may vary linearly with radius. Other sampling densities such as piecewise constant, quadratic, or exponential may also be used.

For additional flexibility, several spiral-PR k-space trajectories may also be arbitrarily interleaved with one another in a given sector to increase the radial sampling density. This is advantageous because in certain cases, there may be limits to the sampling rate that is determined by the bandwidth of the hardware used in the RF unit 42 and the sampling module 38. Furthermore, the duration of sampling "one interleaved waveform" has a maximum which is limited by the properties of the tissue being scanned and in some circumstances one may not have enough time to sample at a given sampling density Δr. However, this can be overcome by interleaving multiple spiral-PR k-space trajectories either with different radial sampling densities Δr or the same radial sampling density with an appropriate radial shift to ensure that the interleaved spiral-PR k-space trajectories do not overlap.

In another alternative embodiment, the period of the sampling function may be increased at larger distances from the k-space origin so that low frequency regions of the k-space data are sampled with a higher sampling density compared to the high frequency regions of k-space data.

The nature of the sampling function and the envelope function used in the spiral-PR k-space sampling trajectory allows one to vary the radial and azimuthal sampling densities independently and arbitrarily. This flexibility in concurrently varying the sampling density in different dimensions allows for a large degree of freedom in altering, and thus optimizing, the resolution-artifact tradeoff.

At least one of the parameters of the spiral-PR k-space trajectory 66 may also be varied in order to generate an undersampled k-space trajectory. For example, FIG. 6b illustrates an undersampled spiral-pr k-space trajectory 82 with the radial and azimuthal undersampling beginning at different points along the trajectory, and varying at different rates of change.

In another alternative, rather than utilizing a "wedge-shape" for the spiral-PR k-space trajectory 66, there are instances where it may be more beneficial to use a different envelope function that provides a shape such that there is overlapping between adjacent sectors of the spiral-PR k-space trajectory. The wedge-shape of the spiral-PR k-space trajectory 66 provides such a possibility depending on the amount of rotation used for adjacent sectors. Further, with trajectory 66, by using different envelope functions, one may vary the degree of overlap along the radial dimension. For instance, one may use a rectangular envelope so that the sectors have a rectangular shape and there is overlapping near the origin of the k-space data. While sampling with overlap in k-space does increase data acquisition time, it does provide more data that can be averaged together to increase the SNR of the MRI image. This may be useful when imaging particularly small structures. The overlap in k-space sampling may also be combined with undersampling to provide a tradeoff between sampling density and SNR.

Referring now to FIG. 5a, shown therein are exemplary waveforms that may be applied to the gradient and RF coil assemblies 24 and 26 to generate gradient magnetic fields and the RF excitation field within the MRI device 20. FIG. 5b shows the corresponding spiral-PR k-space trajectory 74 that results due to the frequency and phase information encoded in the NMR signals by the gradient magnetic fields Gx and Gy.

As described previously, the Gz gradient waveform includes a gradient; waveform 50 for selecting a particular slice of the patient 18 for imaging for a particular duration of time and the RF waveform includes RF pulse 52 for further simultaneously exciting the $^1$H atoms in the patient 18. Once the Gz magnetic gradient waveform 50 and the RF pulse 52 have been terminated, the Gx and Gy gradient magnetic fields are produced to add spatial and phase information to the NMR signals released by the $^1$H atoms, to generate the spiral-PR k-space trajectory 74 shown in FIG. 5b. The waveforms 70 and 72 are used to generate Gx and Gy magnetic field gradients for producing one sector of the k-space trajectory 74. The sampling begins at the origin of k-space; hence there is no negative portion of the Gx waveform 70. A steady magnetic field gradient is applied in the x-direction, the duration of which controls the extent of radial sampling with respect to the k-space origin. While the Gx magnetic field gradient is being produced, the derivative of the spiral sampling function is applied as the Gy magnetic field gradient. Since the sampling function is a sinusoidal waveform in the example given in FIG. 4, the Gy magnetic field gradient is also sinusoidal. After one sector of the spiral-PR k-space trajectory 74 has been sampled, phase shifts are applied to both the Gx and Gy gradient magnetic field waveforms to "rotate" the Gx and Gy waveforms to sample the next sector in the spiral-PR k-space trajectory 74. Those skilled in the art are aware of the amount of rotation that is needed to sample a given sector in the spiral-PR k-space trajectory 74.

The gradient waveforms are typically generated with a given predetermined time duration. The radial spacing Δr is related to the field-of-view (FOV) in the radial direction. As a rough guide, Δr can be selected to be greater than 1/FOV. With the gradient duration and Δr fixed, the remaining parameters of the spiral-PR trajectory may be traded off against one another. Specifically, the larger $\theta_{sector}$, the fewer sectors that will be required to completely acquire the k-space data. However, the larger the value for $\theta_{sector}$, the closer to the k-space origin that the trajectory will terminate at which affects sampling since the distance from the k-space origin is related to spatial resolution.

The control module 34 and the signal generator 36 create the gradient and RF waveforms in response to sampling instructions set in programming code, or to instructions received from the operator interface, that is executed by the computer 12. The sampling instructions include values for parameters for varying the radial sampling density Δr, the azimuthal sampling density, the number of sectors, whether radial interleaving is used, and whether undersampling is used, and if so, the type of undersampling (i.e. radial, azimuthal or both radial and azimuthal) and the degree of undersampling that is used in the spiral-PR k-space sampling trajectory. The sampling instructions can also specify the type of sampling function and envelope function that is used and parameters related thereto. It should be noted that the sampling instructions can also specify the sampling density Δr on a sector-by-sector basis. This can be used in situations in which there are certain sectors of k-space data that should be sampled more heavily (i.e. more densely) to provide more detail in the corresponding area of the resulting MRI image.

The spiral-PR k-space sampling trajectory may also be extended to higher dimensional (i.e. three or more) k-space data sets. In these cases, the spiral-PR k-space sampling trajectory can use spiral sampling on one or more k-space axes, and PR sampling on the remaining k-space axes. For example, for 3D imaging, in which slice selection is not necessarily performed, or only performed to restrict the field of view in the $3^{rd}$ dimension to a relatively wide "slab", a gradient waveform can be applied in the $3^{rd}$ spatial axis during signal collection which may be configured for allowing PR k-space sampling to be done on this dimension. Alternatively, a spiral waveform can be applied on the $3^{rd}$ spatial axis. In general, for a k-space trajectory with n dimensions, with the spiral-PR k-space sampling trajectory, there are n polar parameters and n spiral parameters that can be varied independently to alter the sampling density. This allows for any permutation of spiral and PR waveforms to be spread out over the n-dimensions which combine to provide a spiral-PR k-space trajectory in the k-space domain.

Referring now to FIGS. 6a-6f, experimental results are shown using the hybrid spiral-PR k-space sampling trajectory. FIGS. 6a and 6b show exemplary fully-sampled and under-sampled spiral-PR k-space trajectories 80 and 82, respectively, each having 14 sectors. The dashed and solid double-headed arrowed lines in FIG. 6b indicate regions of radial and azimuthal undersampling respectively for the spiral-PR k-space trajectory 82. It should be noted that in other instances, undersampling may be used for only one of the radial and azimuthal axes. In the same data acquisition time, the undersampled trajectory 82 provides a theoretical resolution of 1.3 mm vs. 2.3 mm for the fully-sampled trajectory 80. The spiral-PR k-space trajectory 82 provides a greater spatial resolution because the extent of sampling in the radial dimension is larger for the spiral-PR k-space trajectory 82 compared to the spiral-PR k-space trajectory 80 since the spiral-PR k-space trajectory 82 is under-sampled. Accordingly, undersampling allows for sampling at greater distances from the origin in k-space, since for a given gradient waveform duration, one does not have to sample as densely.

Figure 6C:
FIGS. 6c and 6d show exemplary phantom images sampled with the spiral-PR k-space trajectories of FIGS. 6a and 6b respectively.
Figure 6D:
Figure 6E:
FIGS. 6e and 6f show exemplary in-vivo cardiac images generated from the spiral-PR k-space trajectories of FIGS. 6a and 6b respectively.
Figure 6F:

FIGS. 6c and 6d show exemplary phantom images 84 and 86 sampled with the spiral-PR k-space trajectories 80 and 82 respectively. FIG. 6d shows that improved resolution is provided by the undersampled trajectory. However, the undersampled image 86 does possess artifact in the form of streaking due to azimuthal undersampling [2], and high-frequency artifact due to radial undersampling [3]. These artifacts are of low-intensity, and do not significantly interfere with the structures in the MRI image. FIGS. 6e and 6f show exemplary in-vivo cardiac images 88 and 90 generated from the spiral-PR k-space trajectories 80 and 82 respectively. A similar improvement in resolution with minimal artifact can be observed in the undersampled in-vivo image 90 of the heart compared to the corresponding fully-sampled image 88.

Figure 7:
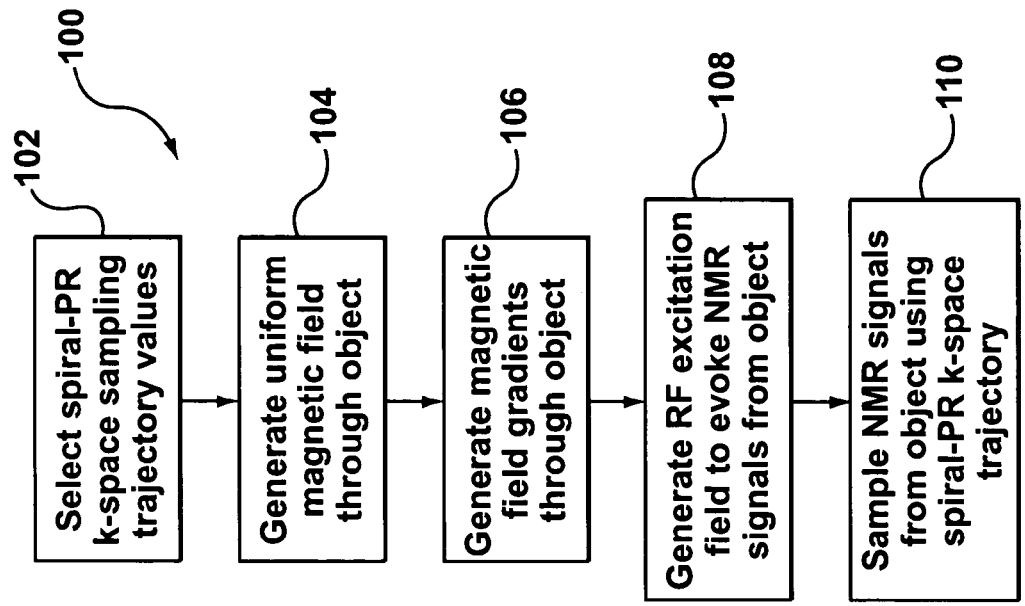
FIG. 7 shows a flowchart diagram of an exemplary method for acquiring MRI data.

Referring now to FIG. 7, shown therein is a flowchart diagram of an exemplary method 100 for acquiring MRI data. At step 102, values are selected for the parameters of the spiral-PR k-space sampling trajectory that is to be used for data acquisition. These parameters can include selecting values for the type of sampling and envelope functions used, whether undersampling is used and if so whether it is in the radial, angular or both radial and angular dimensions. Other parameters for which values can be selected have been discussed above. It should be noted that this step can be optional since parameter values can be preset. For instance, certain types of tests can be preset in which certain parameter values are preselected and saved in memory; one can then select the type of test to be performed and the sampling parameters are then loaded. At step 104, a uniform magnetic field is generated through the object as is commonly known by those skilled in the art. At step 106, magnetic field gradients are generated for imaging a portion of the object. At least a portion of the magnetic field gradients are generated for enabling the particular spiral-PR k-space sampling trajectory that has been defined/selected at step 102. At step 106, an RF excitation field is generated for evoking NMR response signals from the object. At step 110, the NMR response signals are sampled according to the defined/selected spiral-PR k-space trajectory.

The embodiments described herein generally include computer-implemented processes and apparatuses for practicing those processes in the form of computer program code containing instructions embodied in tangible computer media (i.e. CD-ROM, etc.) or any other computer-readable storage medium, wherein, when the computer program code is loaded into and executed by the computer 12, the computer 12 becomes an apparatus for implementing new techniques for acquiring MRI data. Further, the various embodiments described herein have been provided as examples only. It should be understood that various modifications can be made to the embodiments described and illustrated herein, without departing from these embodiments, the scope of which is defined in the appended claims.

REFERENCES

1) C. H. Meyer, B. S. Hu, D. G. Nishimura, A. Macovski, *Magnetic Resonance in Medicine* 1992; 28; pp. 202-213.
2) K. Scheffler, J. Hennig, *Magnetic Resonance in Medicine* 1998; 40; pp. 474-480.
3) C. Tsai, D. G. Nishimura, *Magnetic Resonance in Medicine* 2000; 43; pp. 452-458.
4) J. H. Lee, B. A. Hargreaves, B. S. Hu, D. G. Nishimura, *Magnetic Resonance in Medicine* 2003; 50; pp. 1276-1285.
5) J. I Jackson, D. G. Nishimura, A. Macovski, *Magnetic Resonance in Medicine* 1992; 25; pp. 128-139.
6) M. L. Lauzon, B. K. Rutt, *Magnetic Resonance in Medicine* 1996; 36; pp. 940-949.
7) A. V. Barger, W. F. Block, Y. Toropov, T. M. Grist, C. A. Mistreta, *Resonance in Medicine* 2002; 48; pp. 297-305.
8) D. M. Spielman, J. M. Pauly, C. H. Meyer, *Magnetic Resonance in Medicine* 1995; 34; pp. 388-394.

The invention claimed is:

1. An MRI system for acquiring MRI image data from an object, the MRI system comprising:
    a) an MRI device for generating a uniform magnetic field through the object, magnetic field gradients for imaging a portion of the object and an RF excitation field for evoking NMR response signals from the object;
    b) a computing device for controlling the operation of the MRI system; and
    c) interface circuitry for receiving instructions from the computing device and generating waveforms in response to the instructions and sending the waveforms to the MRI device for producing the magnetic field gradients and the RF excitation field, the interface circuitry being configured to generate the waveforms and sample the NMR response signals according to a spiral-PR k-space trajectory having a plurality of angular sectors, wherein a given angular sector is defined by a sampling function having a period that defines radial sampling density and an envelope function that defines the angular extent of the angular sector.

2. The system of claim 1, wherein the computing device is adapted for varying the period of the sampling function along the radial dimension to provide variable radial sampling density for the given angular sector of the spiral-PR k-space trajectory.

3. The system of claim 2, wherein the computing device is adapted for increasing the period of the sampling function at larger distances from k-space origin to sample low frequency regions of k-space data with a higher sampling density compared to high frequency regions of k-space data.

4. The system of claim 1, wherein the computing device is adapted for selecting a sinusoidal function for the sampling function.

5. The system of claim 1, wherein the computing device is adapted for selecting the radial sampling density to be greater than the inverse of the field of view in the radial direction.

6. The system of claim 1, wherein the angular extent of the envelope function varies along the radial dimension to provide variable azimuthal sampling density for a given sector of the spiral-PR k-space trajectory.

7. The system of claim 1, wherein the computing device is adapted for selecting the envelope function from one of a piece-wise linear function, an exponential function, a staircase function, and a rectangular function.

8. The system of claim 1, wherein the computing device is adapted for interleaving several spiral-PR k-space trajectories to increase radial sampling density, the interleaving being done by employing different radial sampling densities or radial shifts for the several spiral-PR k-space trajectories.

9. The system of claim 1, wherein the computing device is adapted for employing undersampling in at least one of the sampling function and the angular extent of adjacent angular sectors.

10. The system of claim 1, wherein the computing device is adapted for employing radial and azimuthal undersampling beginning at different points along the spiral-PR k-space trajectory.

11. The system of claim 1, wherein the computing device is adapted for adjusting azimuthal sampling density by adjusting the amplitude of the sampling function and the spacing between adjacent angular sectors.

12. The system of claim 1, wherein the computing device is adapted for overlapping adjacent angular sectors of the spiral-PR k-space trajectory.

13. The system of claim 1, wherein the computing device is adapted for applying the spiral-PR k-space sampling trajectory to higher dimensional k-space data sets by using spiral sampling on one or more k-space axes and PR sampling on remaining k-space axes.

14. A method for acquiring MRI image data from an object, the method comprising:
    a) generating a uniform magnetic field through the object;
    b) generating magnetic field gradients for imaging a portion of the object, at least a portion of magnetic field gradients being generated for enabling a spiral-PR k-space sampling trajectory for data acquisition;
    c) generating an RF excitation field for evoking NMR response signals from the object; and
    d) sampling the NMR response signals according to the spiral-PR k-space trajectory having a plurality of angular sectors, wherein a given angular sector is defined by a sampling function having a period that defines radial sampling density and an envelope function that defines the angular extent of the angular sector.

15. The method of claim 14, wherein the method further comprises varying the period of the sampling function along the radial dimension to provide variable radial sampling density for a given sector of the spiral-PR k-space trajectory.

16. The method of claim 15, wherein the method further comprises increasing the period of the sampling function at larger distances from k-space origin to sample low frequency regions of k-space data with a higher sampling density compared to high frequency regions of k-space data.

17. The method of claim 14, wherein the method further comprises selecting a sinusoidal function for the sampling function.

18. The method of claim 14, wherein the method further comprises selecting the radial sampling density to be greater than the inverse of the field of view in the radial direction.

19. The method of claim 14, wherein the method further comprises varying the angular extent of the envelope function along the radial dimension to provide variable azimuthal sampling density for the given angular sector of the spiral-PR k-space trajectory.

20. The method of claim 14, wherein the method further comprises selecting the envelope function from one of a piece-wise linear function, an exponential function, a staircase function, and a rectangular function.

21. The method of claim 14, wherein the method further comprises interleaving several spiral-PR k-space trajectories to increase radial sampling density, the interleaving being done by employing different radial sampling densities or radial shifts for the several spiral-PR k-space trajectories.

22. The method of claim 14, wherein the method further comprises employing undersampling in at least one of the sampling function and the angular extent of adjacent angular sectors.

23. The method of claim 14, wherein the method further comprises employing radial and azimuthal undersampling beginning at different points along the spiral-PR k-space trajectory.

24. The method of claim 14, wherein the method further comprises adjusting azimuthal sampling density by adjusting the amplitude of the sampling function and the spacing between adjacent angular sectors.

25. The method of claim 14, wherein the method further comprises overlapping adjacent angular sectors of the spiral-PR k-space trajectory.

26. The method of claim 14, wherein the method further comprises applying the spiral-PR k-space sampling trajectory to higher dimensional k-space data sets by using spiral sampling on one or more k-space axes and PR sampling on remaining k-space axes.

27. The method of claim 14, wherein the method further comprises using different values for parameters of at least one of the sampling function and the envelope function for different angular sectors.

28. A computer program product for acquiring MRI image data from an object, the computer program product comprising a computer readable medium embodying program code means executable by a processor for carrying out the method of claim 14.

29. An MRI system for acquiring MRI image data from an object, the MRI system comprising:
   a) an MRI device for generating a uniform magnetic field through the object, magnetic field gradients for imaging a portion of the object and an RF excitation field for evoking NMR response signals from the object;
   b) a computing device for controlling the operation of the MRI system; and
   c) interface circuitry for receiving instructions from the computing device and generating waveforms in response to the instructions and sending the waveforms to the MRI device for producing the magnetic field gradients and the RF excitation field, the interface circuitry being configured to sample the NMR response signals by employing a spiral-PR k-space trajectory having a plurality of angular sectors, wherein a given angular sector includes a two-dimensional function with an amplitude bounded by the limits of the given angular sector.

* * * * *